(12) United States Patent
Pagette

(10) Patent No.: US 7,388,237 B2
(45) Date of Patent: Jun. 17, 2008

(54) LOCAL COLLECTOR IMPLANT STRUCTURE FOR HETEROJUNCTION BIPOLAR TRANSISTORS

(75) Inventor: Francois Pagette, Jefferson Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/870,437

(22) Filed: Oct. 11, 2007

(65) Prior Publication Data

US 2008/0083935 A1 Apr. 10, 2008

Related U.S. Application Data

(62) Division of application No. 11/538,848, filed on Oct. 5, 2006.

(51) Int. Cl.
*H01L 31/0328* (2006.01)
*H01L 31/0336* (2006.01)
*H01L 31/072* (2006.01)
*H01L 31/109* (2006.01)

(52) U.S. Cl. ............... 257/197; 257/198; 257/E29.033

(58) Field of Classification Search ............... 257/197, 257/198, 273, 552, 565, E29.033
See application file for complete search history.

(56) References Cited

U.S. PATENT DOCUMENTS

| 5,071,778 | A | 12/1991 | Solheim |
| 5,581,115 | A | 12/1996 | Grubisich et al. |
| 5,698,459 | A | 12/1997 | Grubisich et al. |
| 6,440,812 | B2 | 8/2002 | Violette |
| 6,506,656 | B2 | 1/2003 | Freeman et al. |
| 6,774,002 | B2 | 8/2004 | Chuang |
| 6,979,884 | B2 | 12/2005 | Ahlgren et al. |
| 7,075,126 | B2 | 7/2006 | Greenberg et al. |
| 7,297,992 | B1 * | 11/2007 | U'Ren .................. 257/197 |
| 2004/0188712 | A1 | 9/2004 | Lee et al. |

OTHER PUBLICATIONS

Khater, M., et al, "SiGe HBT Technology with Fmax/fT=350/300 GHz and Gate Delay Below 3.3 ps", Dec. 13, 2004.

* cited by examiner

*Primary Examiner*—Hoai V Pham
(74) *Attorney, Agent, or Firm*—Cantor Colburn LLP; Yuanmin Cai

(57) ABSTRACT

A bipolar transistor structure includes an intrinsic base layer formed over a collector layer, an emitter formed over the intrinsic base layer, and an extrinsic base layer formed over the intrinsic layer and adjacent the emitter. A ring shaped collector implant structure is formed within an upper portion of the collector layer, wherein the ring shaped collector implant structure is disposed so as to be aligned beneath a perimeter portion of the emitter.

18 Claims, 18 Drawing Sheets

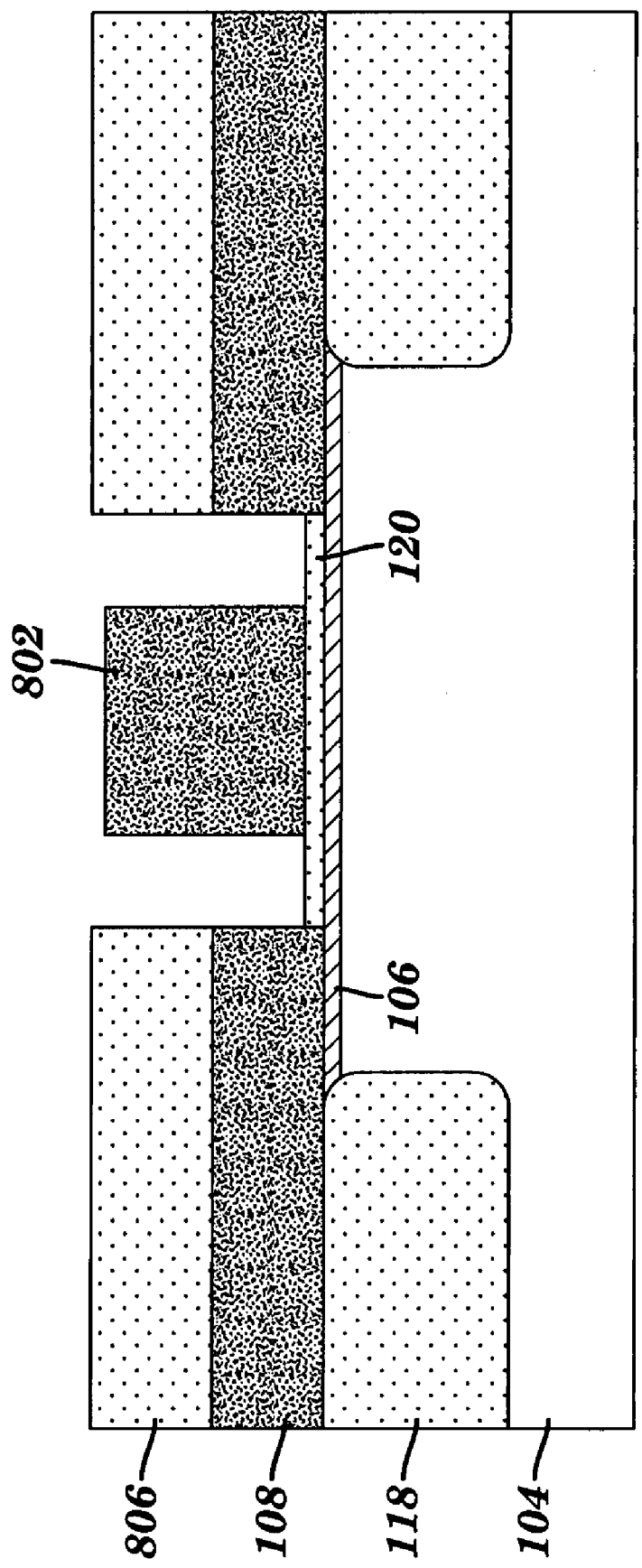

LOCAL COLLECTOR IMPLANT STRUCTURE FOR HETEROJUNCTION BIPOLAR TRANSISTORS

CROSS REFERENCE TO RELATED APPLICATIONS

This application is a divisional application of U.S. Ser. No. 11/538,848, filed Oct. 5, 2006, the contents of which are incorporated by reference herein in their entirety.

BACKGROUND

The present invention relates generally to bipolar transistor technology, and, more particularly, to an improved local collector implant structure for heterojunction bipolar transistors (HBT) and method of forming the same.

The improvement in transistor performance, especially the operation speed, is an essential requirement for increased bandwidth and data rate for network communications. As silicon based technology enables large scale integration, an increase in the operation of silicon based devices is a key to achieving a low cost implementation of such systems. The heterojunction bipolar transistor (HBT) is an improvement of the bipolar junction transistor (BJT) that can handle signals of very high frequencies up to several hundred GHz. HBT technology is commonly found in modern ultrafast circuits, such as radio-frequency (RF) systems.

The principal difference between the BJT and HBT is the use of differing semiconductor materials (e.g., silicon, germanium) for the emitter and base regions, thus creating a heterojunction. The effect is to limit the injection of holes into the base region, since the potential barrier in the valance band is so large. Unlike BJT technology, this allows for high doping to be used in the base, thereby reducing the base resistance while maintaining gain.

There are several different critical features in the design of high performance bipolar transistors, including HBT devices. Such features include, for example, the vertical dimension of the transistor, the collector doping, base-collector and base-emitter capacitances, and collector and base resistances. To achieve higher performance, it is generally desirable to reduce the vertical dimension of the transistor, which reduces the transit time and thus can increase performance. Also, it is generally desirable to increase the collector doping concentration. This reduces collector resistance and thus can also increase performance. These goals are generally compatible, as a vertical dimension reduction is achieved partly by the increase in collector doping concentration since the base-collector space-charge region shrinks with higher doping concentrations.

However, simply reducing transistor vertical dimension and increasing the collector doping concentration has the negative result of increasing base-collector capacitance. The increase in base-collector capacitance in turn has a negative impact on the performance of the device, and thus can negate the benefits of reducing the vertical dimension and increasing collector doping concentration. As SiGe HBT switching speeds begin to exceed 350 GHz, it becomes increasingly important to reduce the parasitic base-collector capacitance while also delaying the Kirk effect.

HBT devices usually achieve their peak AC performance at relatively high collector current densities, which are needed to load the parasitic capacitance in a short time frame. As the collector current is increased, a larger portion of the current travels at the perimeter of the emitter due to current crowding. The Kirk effect is due to the high current density, which forces the space charge region of the base-collector junction to get pushed into the collector region, thus reducing the frequency response of the transistor. Accordingly, it would be desirable to construct an HBT device that provides a further reduction in base-collector capacitance, while also delaying the Kirk effect and reducing collector resistance.

SUMMARY

The foregoing discussed drawbacks and deficiencies of the prior art are overcome or alleviated by, in an exemplary embodiment, a bipolar transistor structure including an intrinsic base layer formed over a collector layer, an emitter formed over the intrinsic base layer, and an extrinsic base layer formed over the intrinsic layer and adjacent the emitter. A ring shaped collector implant structure is formed within an upper portion of the collector layer, wherein the ring shaped collector implant structure is disposed so as to be aligned beneath a perimeter portion of the emitter.

In one embodiment, the transistor structure further includes a lower collector implant structure formed within a lower portion of the collector layer, in electrical contact with the ring shaped collector structure, wherein the lower collector implant structure is disposed so as to be aligned beneath an interior, center portion of the emitter.

The lower collector implant structure and the ring shaped collector structure have a higher dopant concentration with respect to the collector layer.

In another embodiment, the collector layer, lower collector implant structure, ring shaped collector implant structure and the emitter are doped with an N-type material, and the extrinsic and intrinsic base layers are doped with a P-type material.

An outer diameter of the ring shaped collector implant structure coincides with an emitter opening defined between edges of the extrinsic base layer.

BRIEF DESCRIPTION OF THE DRAWINGS

Referring to the exemplary drawings wherein like elements are numbered alike in the several Figures:

FIGS. 8(a) through 8(k) illustrate a sequence of exemplary process flow diagrams for forming the HBT structure shown in FIG. 6.

DETAILED DESCRIPTION

Disclosed herein is an improved local collector implant structure for heterojunction bipolar transistors and method of forming the same that reduces base-collector capacitance while also delaying the Kirk effect, thereby achieving high AC performance. Briefly stated, a ring shaped region of increased collector dopant is introduced beneath the perimeter region of the emitter, where the majority of collector current travels at high frequencies due to current crowding. The ring is self-aligned to the emitter, and as a result, collector resistance is reduced with a minimal increase in base-collector capacitance, as the increased collector doping is localized within the ring configuration at the periphery of the emitter, and not beneath the central, interior portion of the emitter (or under the extrinsic base).

Figure 1:
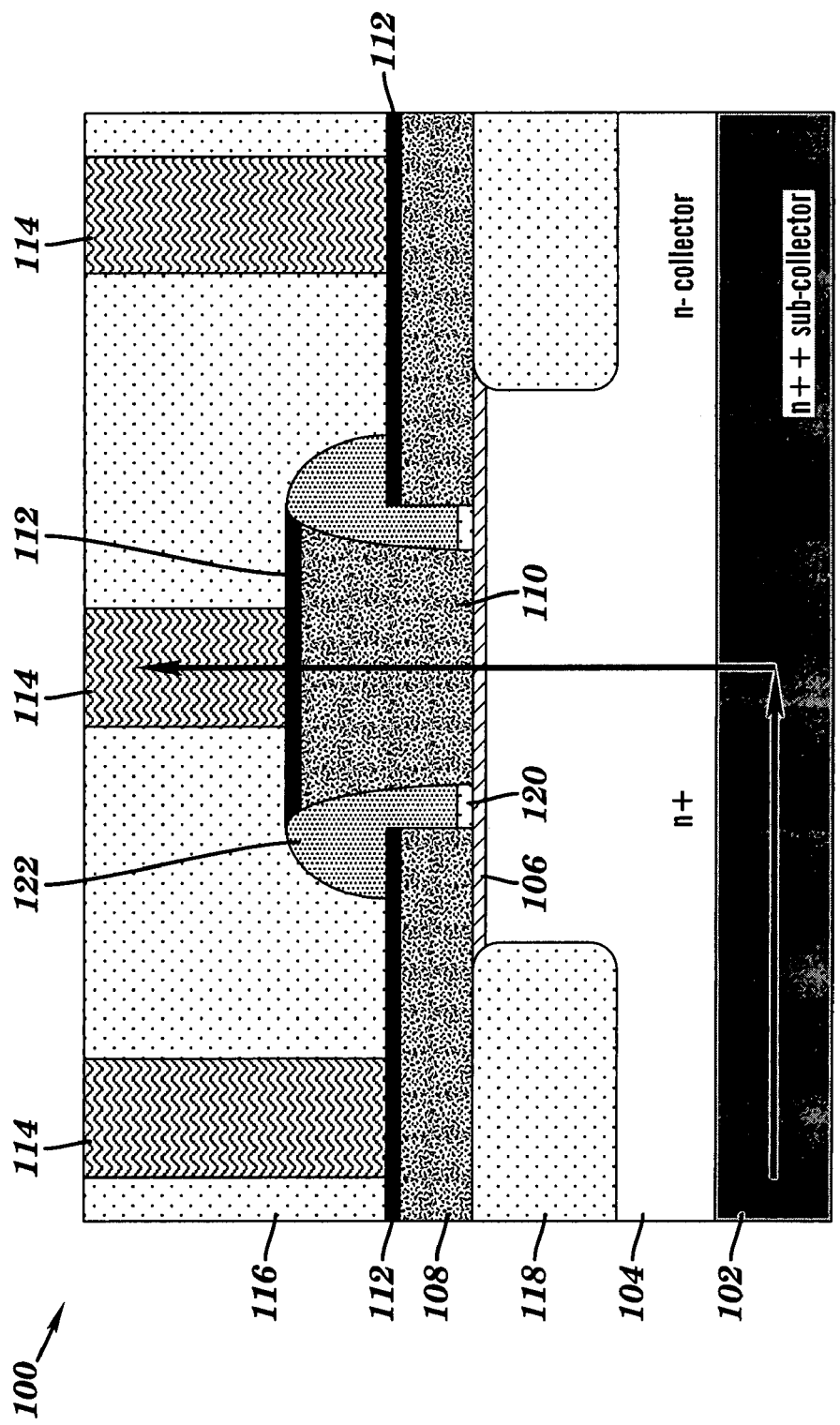
FIG. 1 is a cross sectional view of a conventional HBT structure.

Referring initially to FIG. 1, there is shown a cross sectional view of a conventional HBT structure 100. As is shown, the exemplary N-type HBT structure 100 includes an N++ doped, buried sub-collector region 102 formed within a substrate, and an N+ doped collector region 104 formed over the sub-collector region 102. One skilled in the art will also recognize intrinsic base layer 106 formed, for example, by low temperature epitaxial (LTE) growth of single crystal layer (such as SiGe) and doped with a P-type dopant (such as boron). Both the (P-type) raised extrinsic base structure 108 and the (N-type) emitter 110 are formed from a polysilicon material, and are shown with silicide contacts 112 for providing ohmic contact to metal filled vias 114 formed within the interlevel dielectric layer (ILD) 116. Also illustrated in the HBT structure 100 of FIG. 1 are shallow trench isolation (STI) regions 118 (e.g., oxide), oxide layer 120, and nitride spacers 122. For purposes of illustration, arrows are shown to depict the current path from the collector through the emitter in FIG. 1.

Figure 2:
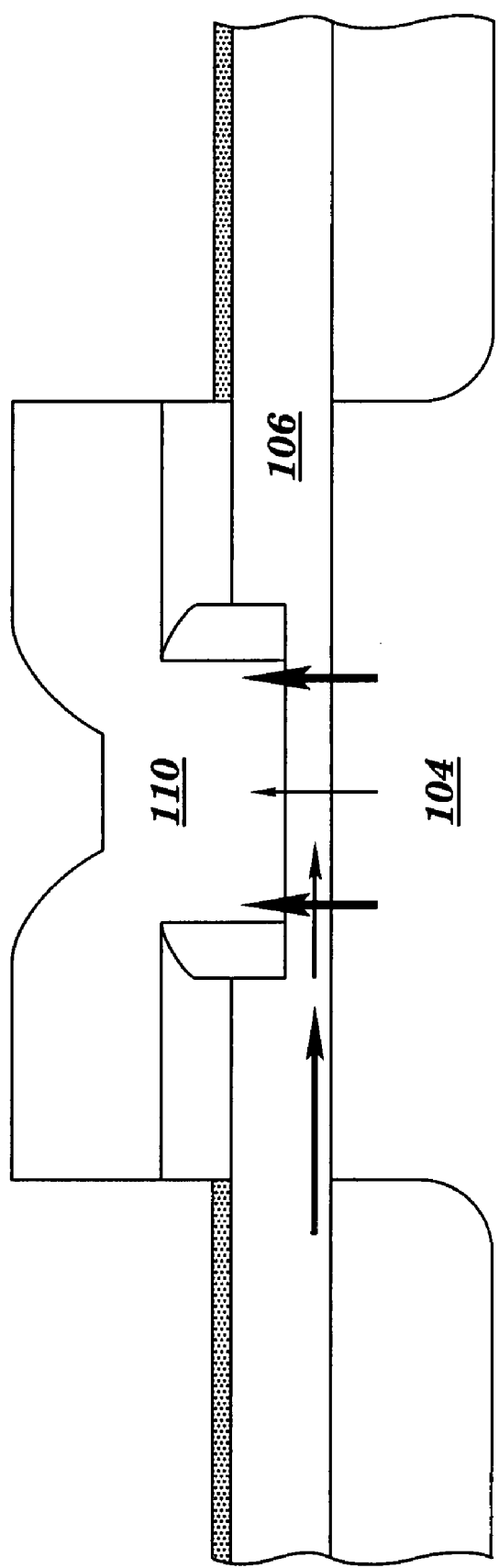
FIG. 2 is a schematic diagram illustrating the current-crowding effect in an HBT device.

As will be noted, the entire collector region 104 is formed with the N+ dopant. Although this universally doped collector structure reduces the degree of collector resistance (and hence tends to increase the maximum oscillating frequency, $f_{max}$, and the cut-off frequency, $f_T$, of the HBT), the resulting increase in parasitic base-collector capacitance due to the N+ dopant tends to offset such gains. FIG. 2 schematically depicts the current crowding (Kirk) effect of a bipolar device, wherein the base current (horizontal arrows) encounters resistance as it travels laterally under the emitter 110. At high frequencies, the current density of the emitter (vertical arrows) is greater at the periphery of the emitter than in the center of the emitter, with the emitter-base junction bias being larger at the edge than the center of the emitter.

Figure 3:
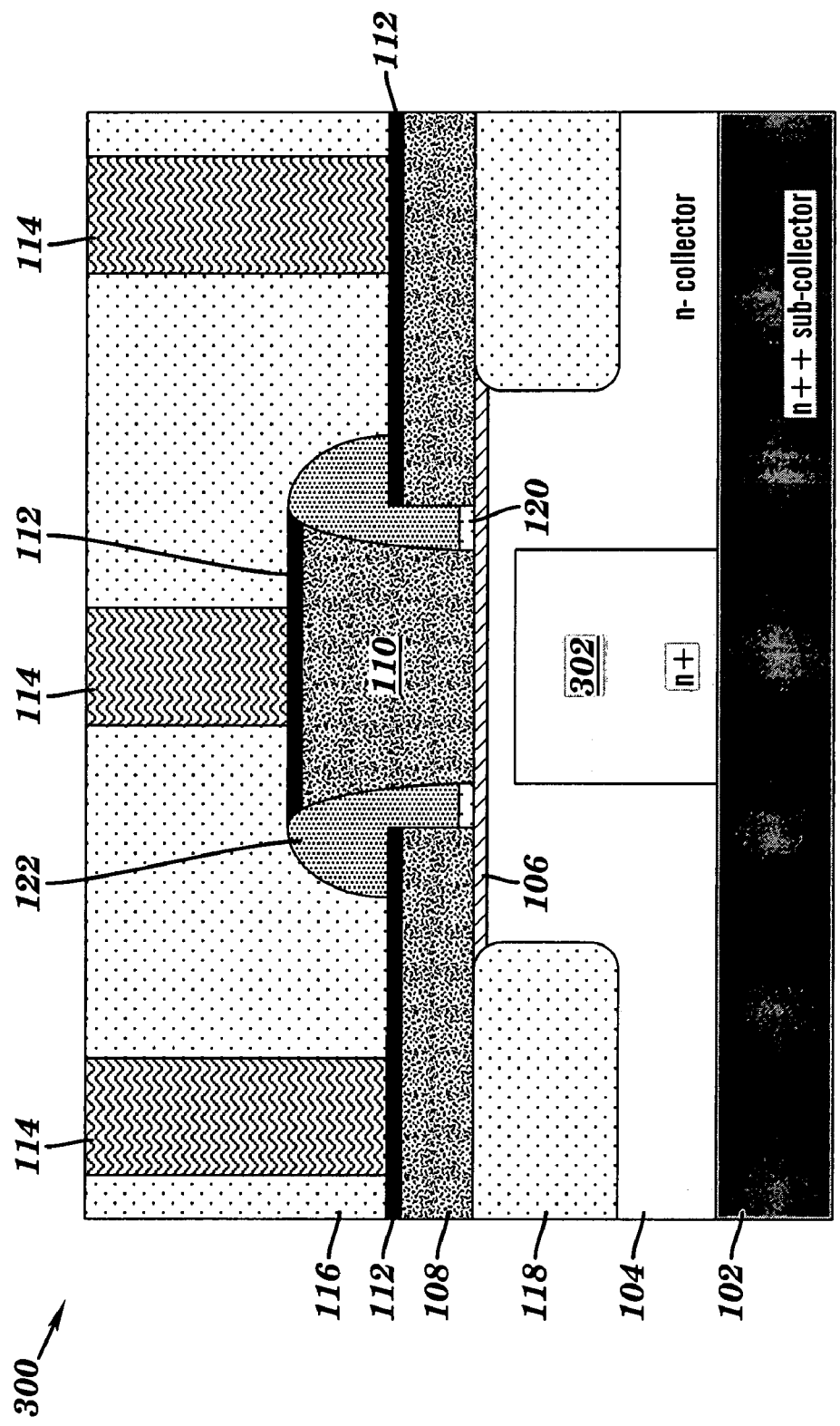
FIG. 3 is a cross sectional view of one existing example of an HBT structure having a local collector implant structure for reducing collector resistance and collector-base capacitance.

Accordingly, one way to reduce the Kirk effect while also reducing the base-collector parasitic capacitance outside the collector current path is to provide a localized collector implant in the collector region, self-aligned to the emitter structure. In this manner, only the local implant is provided with the higher concentration of N+ dopant, instead of the entire collector region. An example of such a local collector implant is illustrated in HBT structure 300 FIG. 3. As can be seen, the collector layer 104 is not provided with N+ dopant in its entirety, but rather, a local N+ type implant 302 is formed therein, corresponding to (and self-aligned with) the emitter region 110. Thus configured, the higher doped implant region 302 reduces the Kirk effect and collector resistance, while outside the collector current path, the lower doped N-type collector material keeps the collector-base capacitance in this region low.

Figure 4:
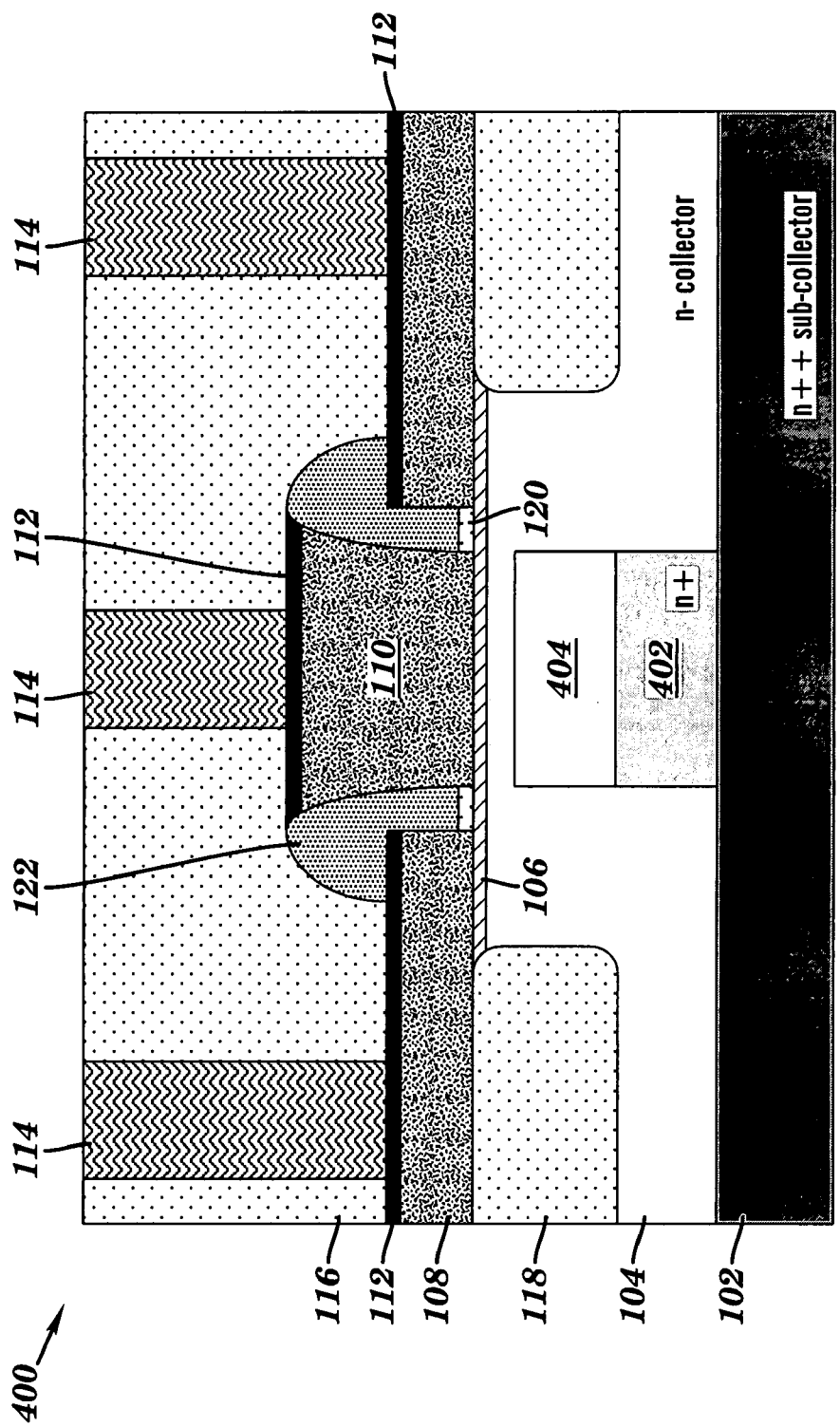
FIG. 4 is a cross sectional view of another existing example of an HBT structure having a local collector implant structure with a stepped dopant profile.

FIG. 4 illustrates another type of collector structure for an HBT device 400, in which the collector implant has a stepped profile, such that a lower region 402 of the implant structure has a higher dopant concentration than an upper region 404. As is the case with implant structure 300 of FIG. 3, the stepped collector implant structure of FIG. 4 is self-aligned to the emitter structure by dopant implantation through the emitter opening. The deeper implant (region 402) links the buried collector 104 to the sub-collector 102, providing a low resistance path to the sub-collector 102. The shallow implant (region 404) reduces the base-collector space charge region width and tailors the collector-base breakdown characteristics. As is the case with implant structure 300 of FIG. 3, base-collector capacitance is reduced outside the collector current path. Additional information concerning the stepped collector implant structure of FIG. 4 may be found in U.S. Pat. No. 6,506,656 to Freeman, et al., assigned to the assignee of the present application, and the contents of which are incorporated herein by reference in their entirety.

Figure 5:
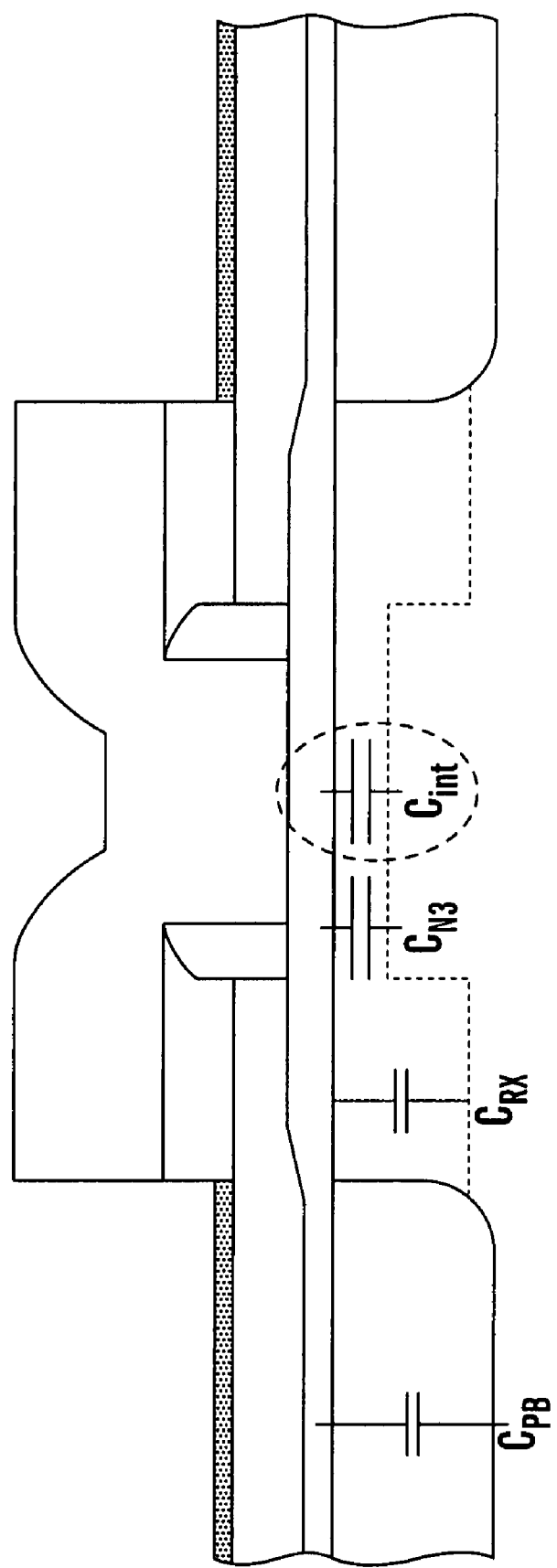
FIG. 5 is a schematic diagram illustrating various parasitic capacitance components of the HBT structures shown in FIGS. 3 and 4.

However, notwithstanding the benefits of a local collector implant structure as described above, the location/structure of the collector dopants is still not optimized, in view of the current crowding depicted in FIG. 2. In other words, the dopant of the above-described local collector implant structures is the same within the collector current path, with respect to the cross-sectional length of the emitter structure. Accordingly, the collector-base capacitance of the interior portions of the collector current path (i.e., beneath the inner region of the emitter) is substantially the same as the exterior portions of the collector current path (i.e., beneath the perimeter of the emitter), notwithstanding the increased current density at the perimeter of emitter at high frequencies. Schematically, this is depicted in FIG. 5. As is shown, the local collector implant structure reduces parasitic capacitance in the extrinsic base regions (denoted by $C_{PB}$) and in the extrinsic base regions outside the collector current path (denoted by $C_{RX}$). On the other hand, the parasitic capacitance is increased in the collector current path at both the peripheral region of the emitter (denoted by $C_{N3}$) and the inner region of the emitter (denoted by $C_{int}$).

Figure 6:
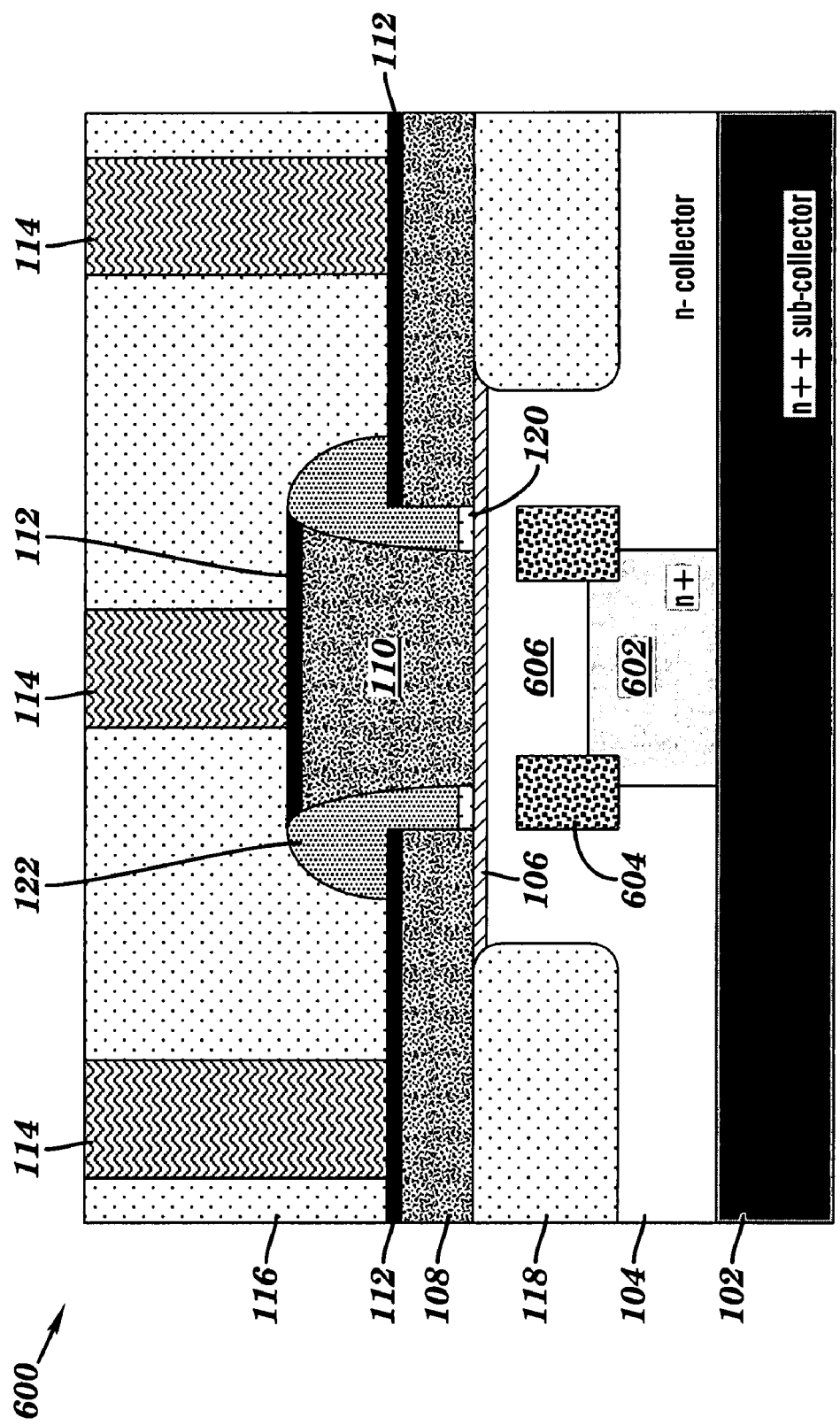
FIG. 6 is a cross sectional view of an HBT structure having a local ring shaped collector implant structure, in accordance with an embodiment of the invention.
Figure 7:
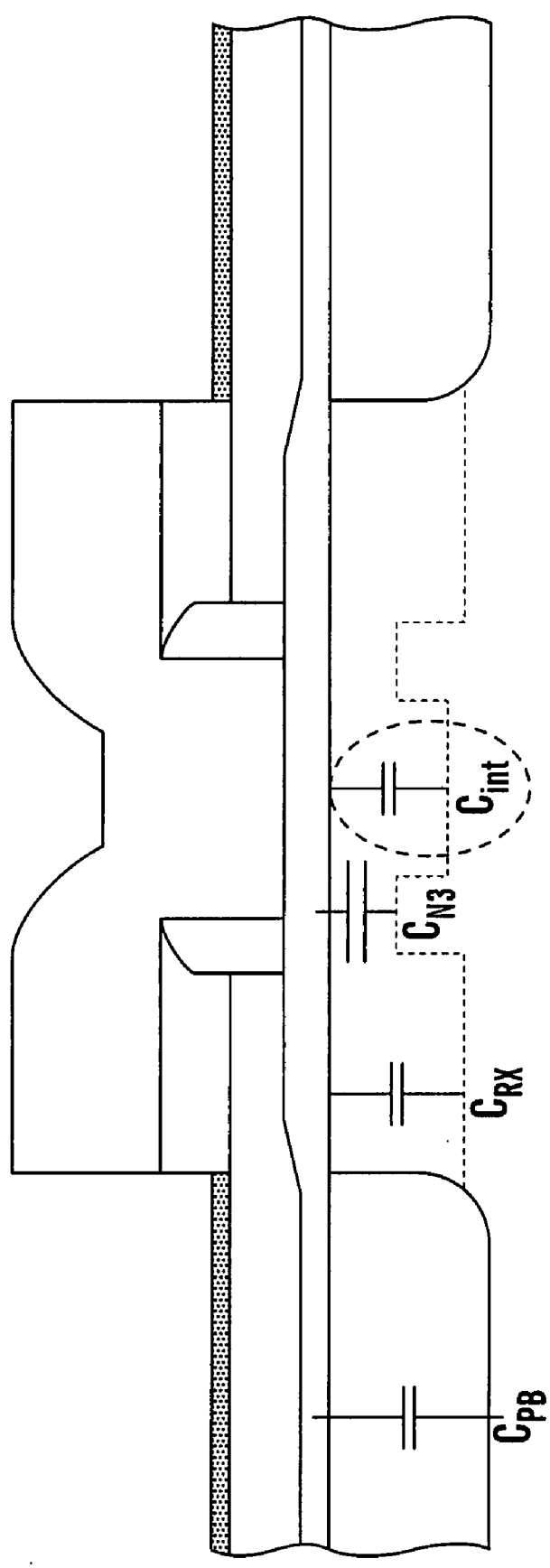
FIG. 7 is a schematic diagram illustrating various parasitic capacitance components of the HBT structure shown in FIG. 6.

Therefore, in accordance with an embodiment of the invention, FIG. 6 is a cross sectional view of an HBT structure 600 having a local, ring shaped collector implant structure 604 (also referred to as a ring shaped dopant profile herein) formed over a deeper collector implant 602. The location of the ring shaped implant structure 604 coincides with the larger current density associated with the perimeter of the emitter 110 due to current crowding. The dopant concentration of the ring shaped implant 604 can be made lower or higher than the collector implant structure 602, but is at least larger than the dopant concentration in collector region 104 as needed to best optimize the device performance. As such, the increase in base-collector capacitance at region 606 of the collector (beneath the center of the emitter 110) is minimized due to the lower collector dopant concentration therein. On the other hand, the increased collector doping of the ring structure 604 reduces the collector resistance at a precisely tailored location corresponding to the bulk of the current density location, so as to delay the Kirk effect. The resulting improvement in parasitic base-collector capacitance is schematically depicted in FIG. 7. Whereas the component of base-collector capacitance in the collector current path is substantially the same at both the peripheral region of the emitter ($C_{N3}$) and the inner region of the emitter ($C_{int}$) in FIG. 5, the absence of the increased dopant beneath the inner region of the emitter leads to an even further decreased value of $C_{int}$.

An exemplary process flow for forming the ring-shaped collector implant structure 604 for an HBT device is depicted in FIGS. 8(a) through 8(l). At the point of processing shown in FIG. 8(a), the shallow trench isolation regions 118 are formed within the lightly doped collector region 104, which has the LTE intrinsic base layer 106 grown thereon. For purposes of simplicity, the sub-collector layer beneath the collector region 104 is not illustrated in FIGS. 8(a) through 8(l). The oxide layer 120 has a sacrificial polysilicon block 802 formed thereon, which in turn is covered by a sacrificial spacer (e.g., nitride) layer 804. The polysilicon block 802 is dimensioned so as to correspond to the interior region of the subsequently formed emitter layer. As then shown in FIG. 8(b), the polysilicon material used for the raised extrinsic base layer 108 is formed.

Figure 8A:
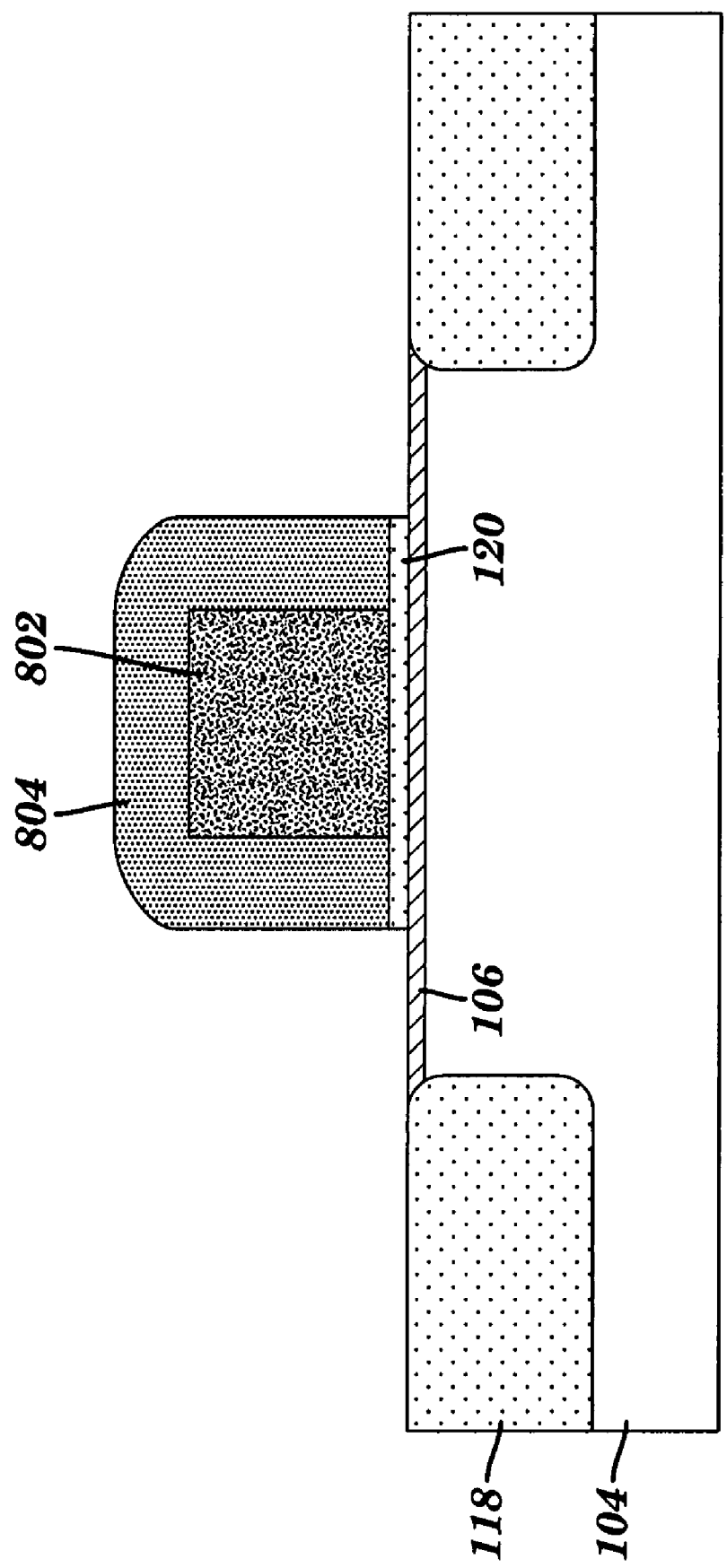
Figure 8B:
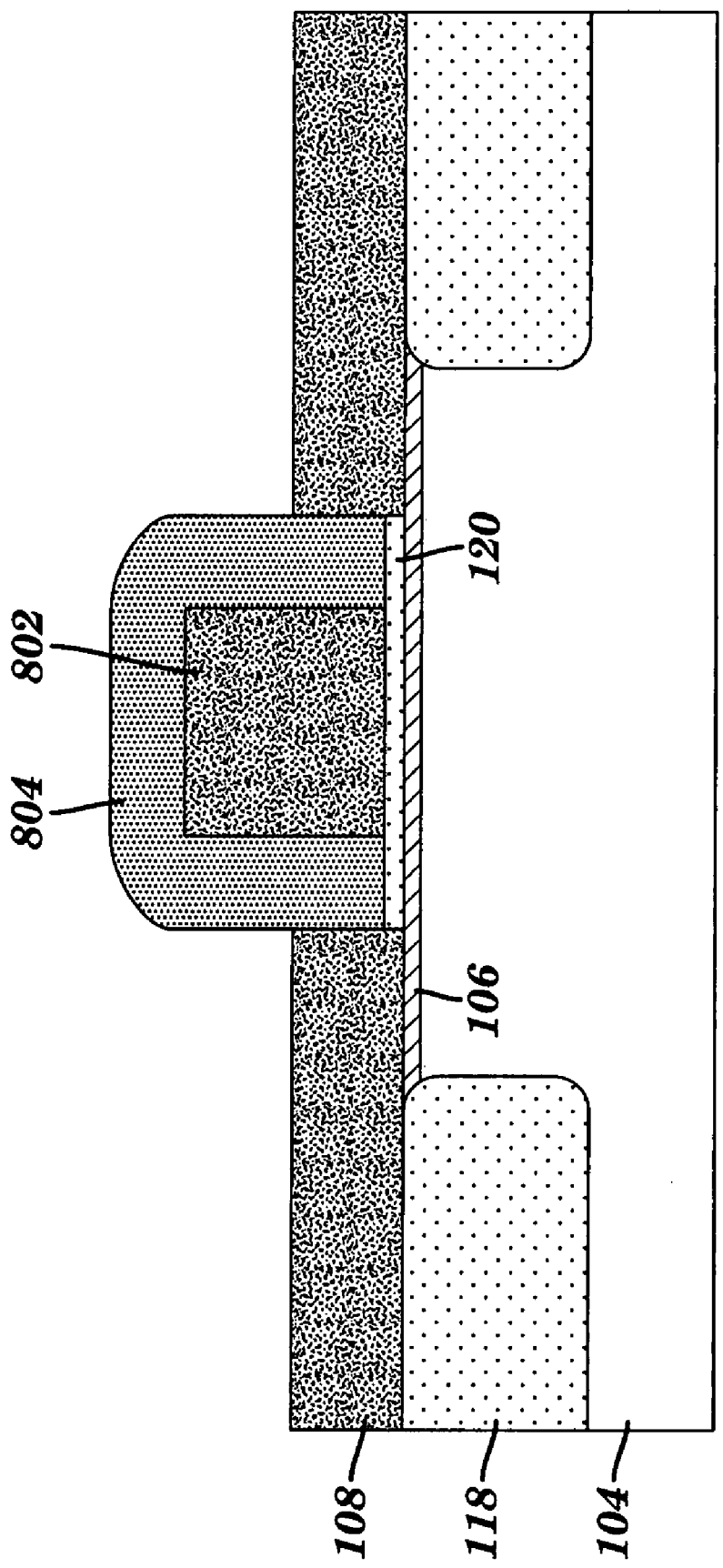
Figure 8C:
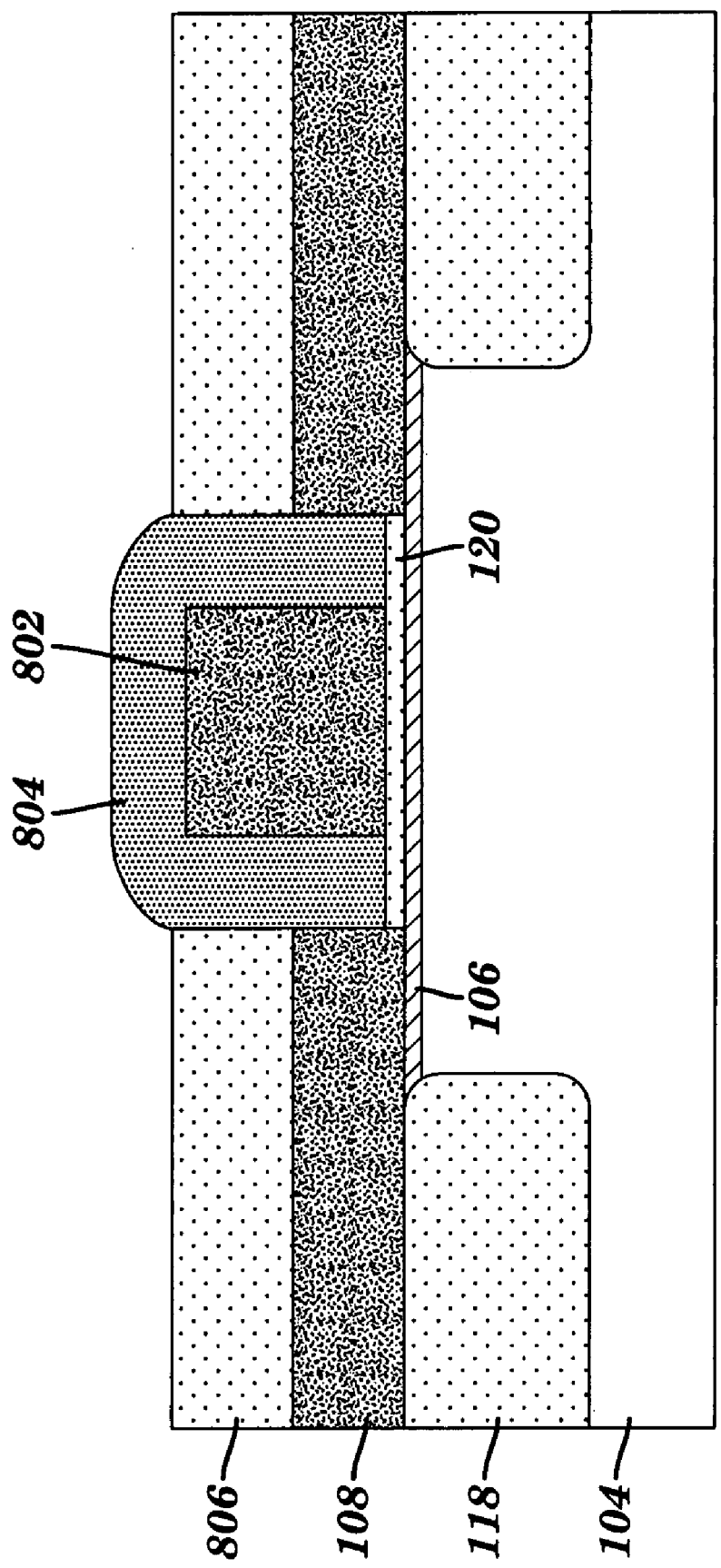
Figure 8E:
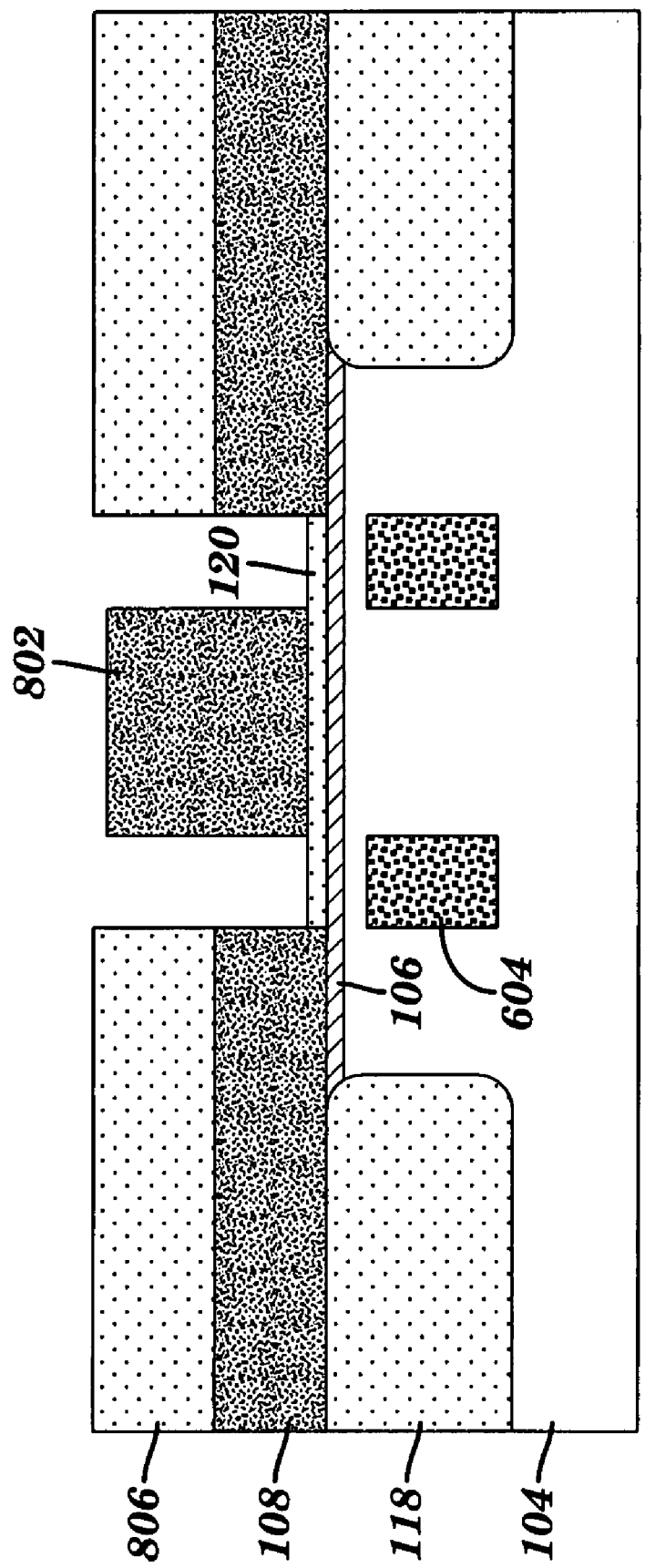

Proceeding to FIG. 8(c), a protective oxide layer 806 is formed over the extrinsic base layer 108, after which the sacrificial spacer layer 804 is removed in FIG. 8(d). This exposes a portion of the collector layer 104 between the extrinsic base layer 108 and the sacrificial block 802 to a dopant implant step that results in the formation of the ring shaped collector implant structure 604, as shown in FIG. 8(e). Thus, the outer diameter of the ring shaped collector implant structure 604 coincides with an emitter opening defined between the edges of the extrinsic base layer 108.

Figure 8F:
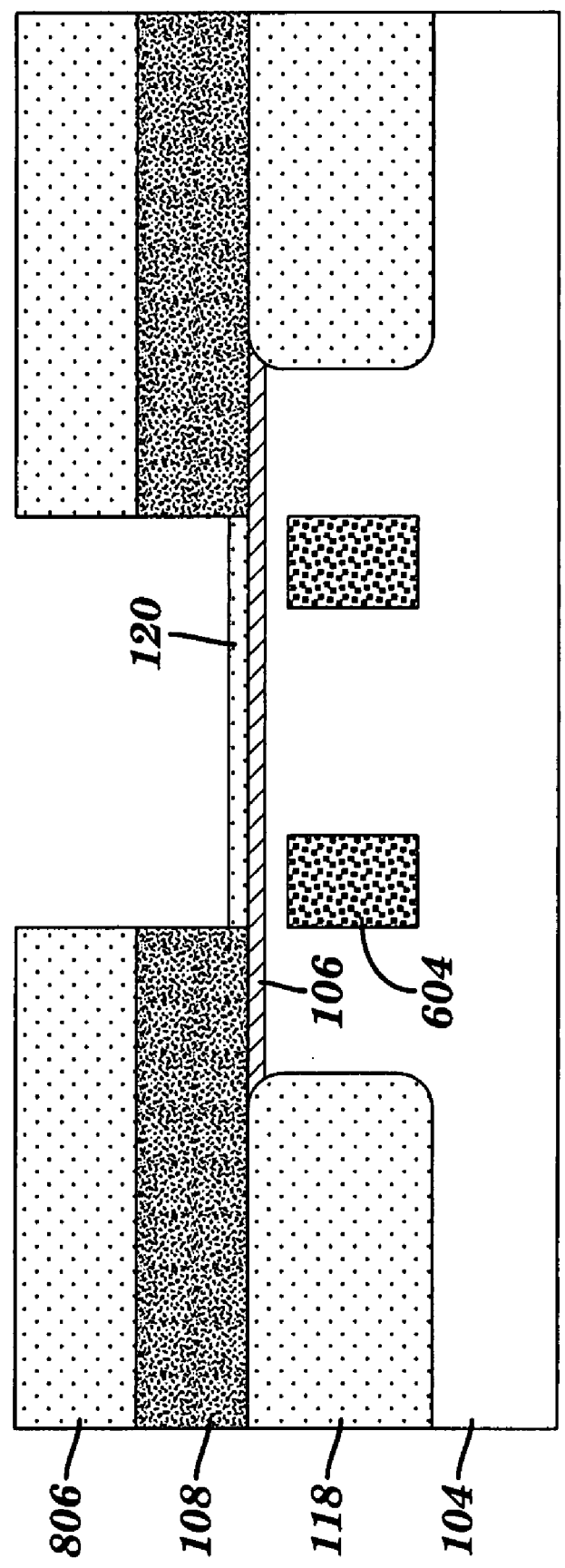
Figure 8G:
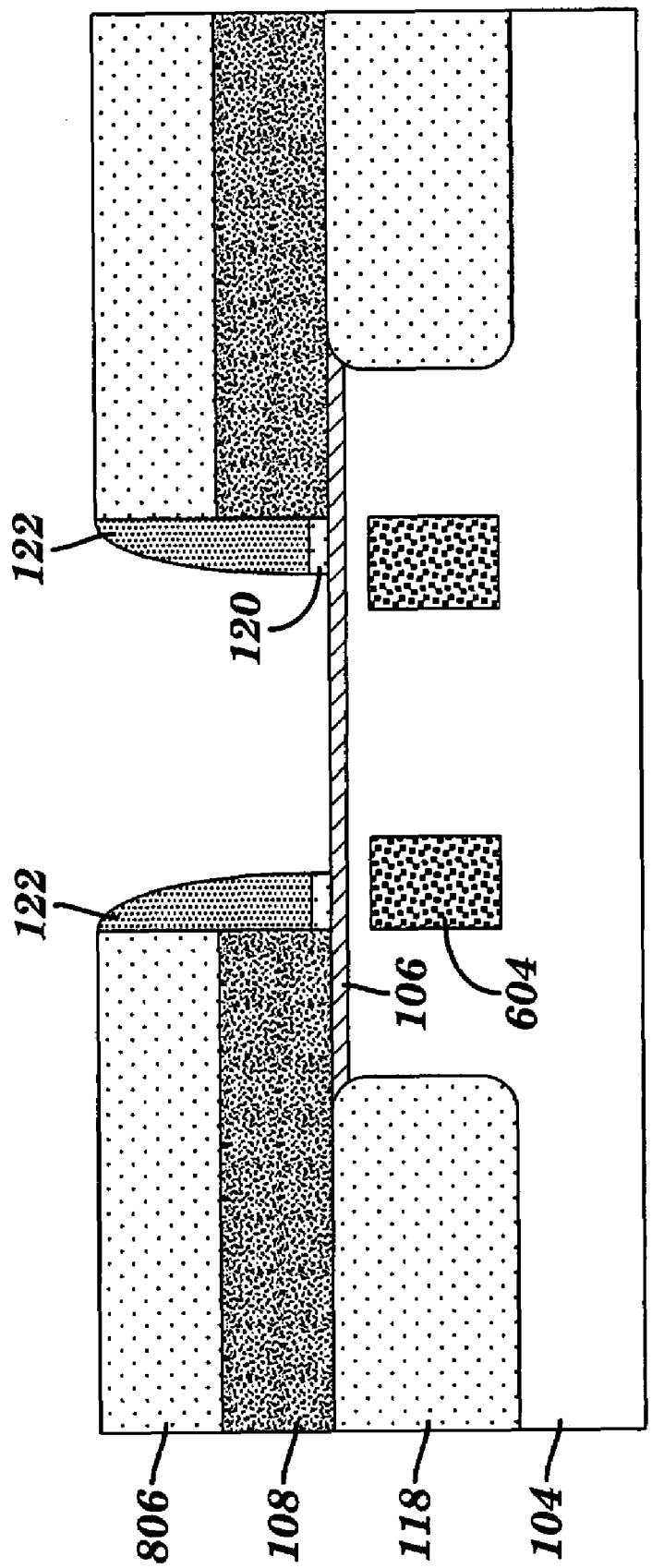
Figure 8H:
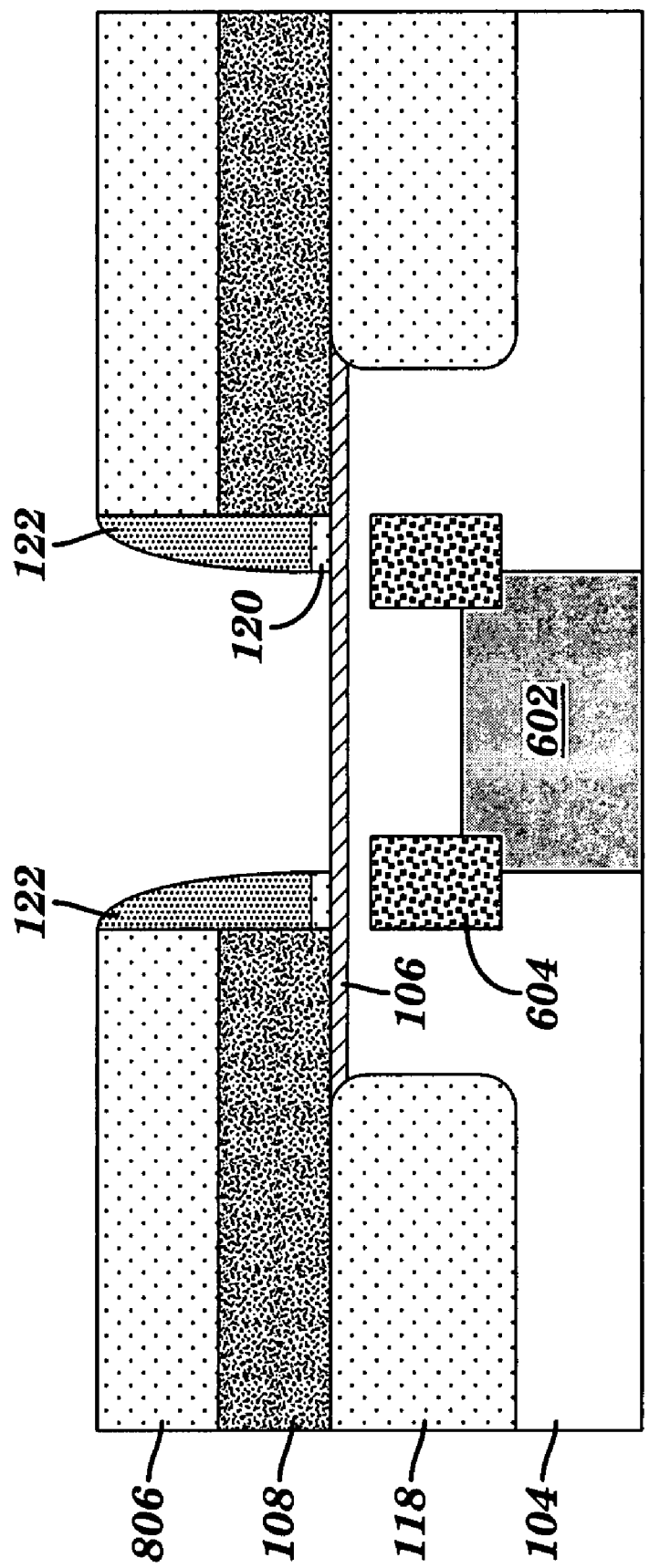

In FIG. 8(f), the sacrificial block 802 is removed, such as by an etch process selective to polysilicon, in order to prepare the device for emitter formation. First, in FIG. 8(g), nitride sidewall spacers 122 are formed, the etching of which also results in the etching of oxide layer 120 so as to expose the intrinsic base layer 106. Then, as shown in FIG. 8(h), the lower collector implant structure 602 is formed through a dopant implantation (e.g., at a dopant concentration exceeding that of collector layer 104). Due to the formation of spacers 122, it will be noted that the lower implant structure 602 is essentially aligned beneath the center portion of the subsequently formed emitter, while the ring shaped implant structure 604 is aligned beneath the periphery of the subsequently formed emitter. As such, the outer diameter of the ring shaped implant structure 604 exceeds the outer diameter of the lower implant structure.

Figure 8I:
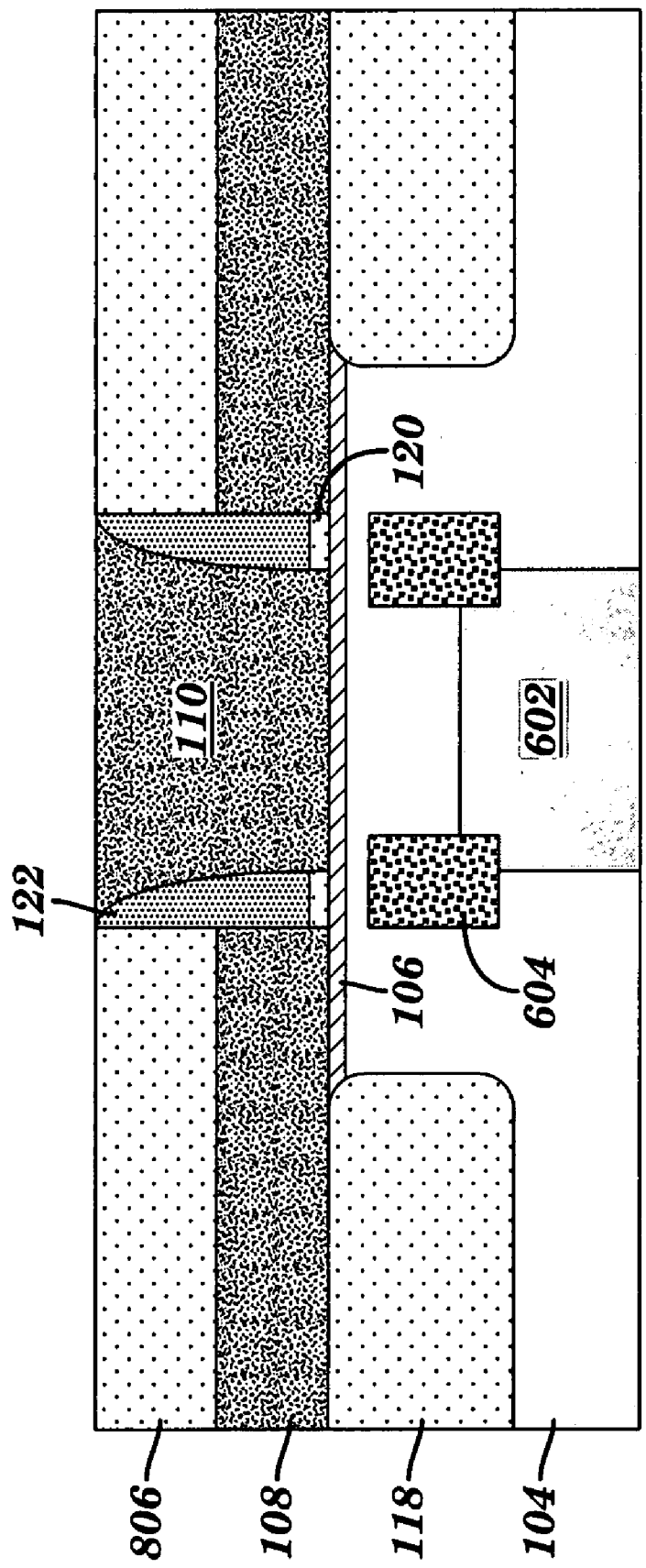
Figure 8J:
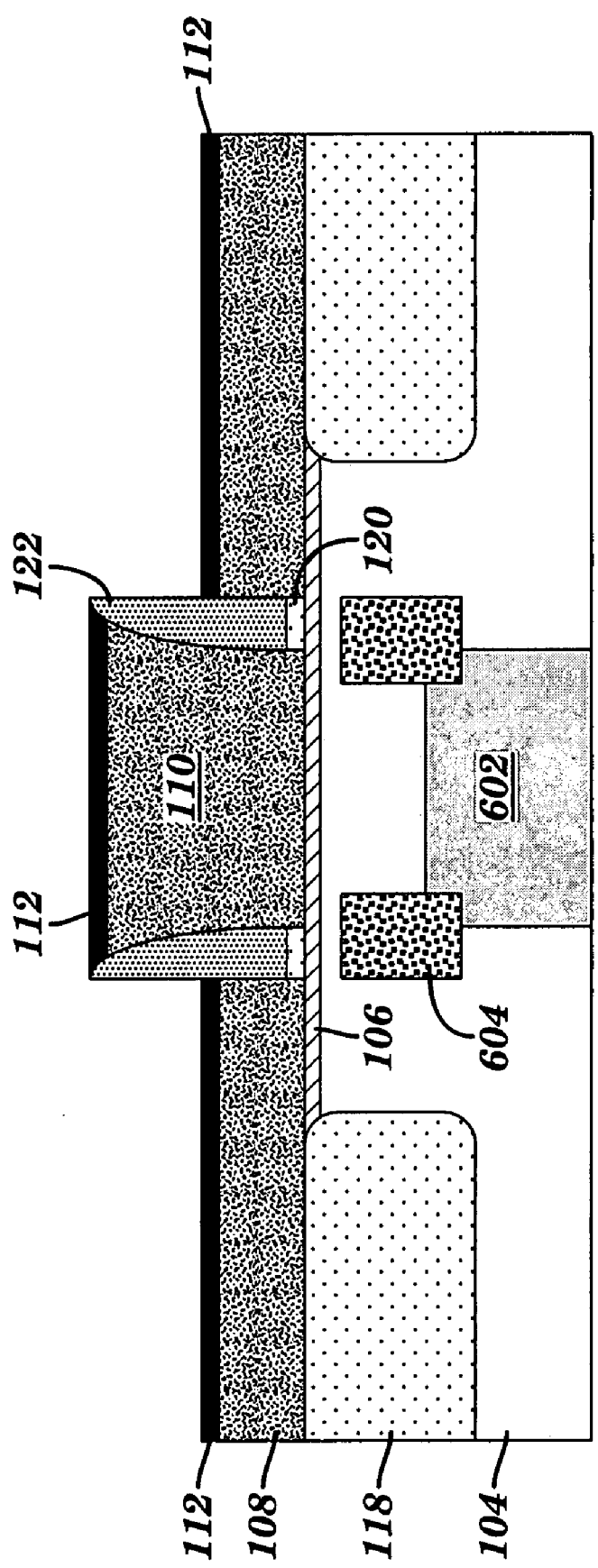

Referring to FIG. 8(i), the polysilicon material for the emitter 110 is deposited, planarized and doped with a suitable N-type dopant (e.g., phosphorous). Upon formation of the emitter 110, the protective oxide layer 806 may be removed, down to the top of the extrinsic base layer 108, as shown in FIG. 8(j). At this point, the exposed polysilicon of the extrinsic base layer 108 and emitter 110 are silicided in accordance with known techniques to form silicide contacts 112, as also shown in FIG. 8(j).

Figure 8K:
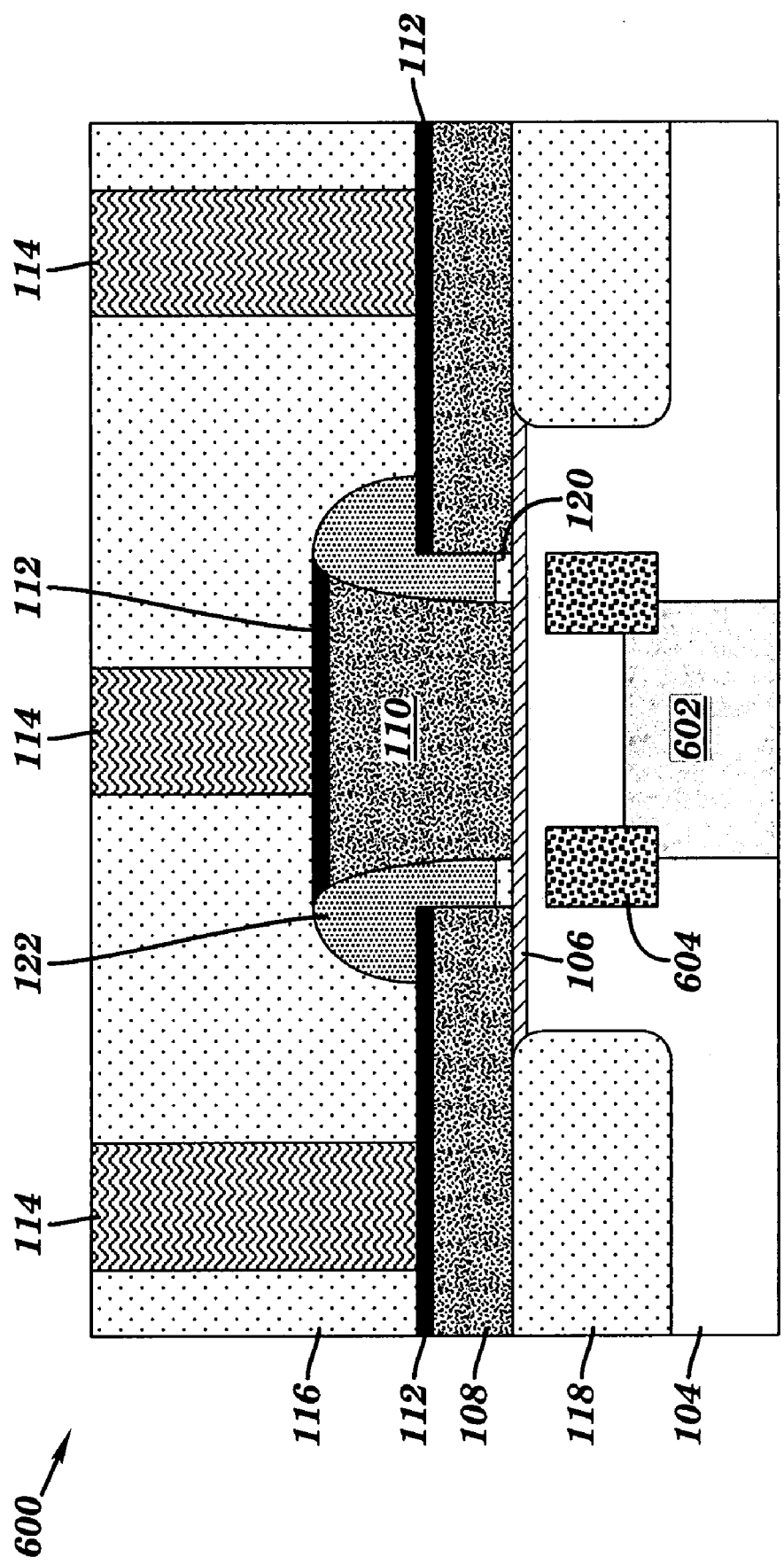

Finally, the HBT structure 600 is provided with an interlevel dielectric layer 116, as shown in FIG. 8(k), and the ILD layer 116 is patterned to form the metal filled vias 114 for connecting the terminals of the HBT device to upper wiring levels. In order to prevent shorting between the emitter 110 and the extrinsic base layer 108, the spacers 122 are widened in FIG. 8(k) to provide for a greater alignment tolerance for vias 114. Additional information concerning spacer widening adjacent an emitter region may be found in U.S. Pat. No. 6,979,884 to Ahlgren, et al., assigned to the assignee of the present application, and the contents of which are incorporated herein by reference in their entirety. It will also be noted that additional vias (not shown) would be used to make electrical contact to the collector layer 104 as well.

In addition to silicon based bipolar transistors including Si/SiGe heterojunction bipolar transistors, it will be appreciated that the invention embodiments can also be applied to other types of heterojunction bipolar transistors including, but not limited to: AlGaAs/GaAs, InGaP/GaAs, InP/InGaAs, InAlAs/InGaAs, and InAlGaAs/InGaAs single and double heterojunction bipolar transistors with GaAs, InGaAs, InP, AlGaAs, InGaP, InAlAs, or a combination thereof as the collector material.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A bipolar transistor structure, comprising:
an intrinsic base layer formed over a collector layer;
an emitter formed over the intrinsic base layer;
an extrinsic base layer formed over the intrinsic base layer and adjacent the emitter; and
a ring shaped collector implant structure formed within an upper portion of the collector layer, wherein the ring shaped collector implant structure is disposed so as to be aligned beneath a perimeter portion of the emitter.

2. The transistor structure of claim 1, further comprising a lower collector implant structure formed within a lower portion of the collector layer, in electrical contact with the ring shaped collector structure, wherein the lower collector implant structure is disposed so as to be aligned beneath an interior, center portion of the emitter.

3. The transistor structure of claim 2, wherein the lower collector implant structure and the ring shaped collector structure have a higher dopant concentration with respect to the collector layer.

4. The transistor structure of claim 3, wherein a region of the collector layer above the lower collector implant structure, within a perimeter of the ring shaped collector implant structure, and beneath the center of the emitter has a lower dopant concentration than the ring shaped collector implant structure and the lower collector implant structure.

5. The transistor structure of claim 4, wherein a first component of base to collector capacitance associated with a collector current path beneath the interior, center portion of the emitter is less than a second component of base to collector capacitance associated with the collector current path beneath the perimeter portion of the emitter.

6. The HBT device of claim 4, wherein the intrinsic base layer comprises a single crystal layer of SiGe.

7. The transistor structure of claim 2, wherein the collector layer, lower collector implant structure, ring shaped collector implant structure and the emitter are doped with N-type semiconductor material, and the extrinsic and intrinsic base layers are doped with P-type semiconductor material.

8. The transistor structure of claim 2, wherein an outer diameter of the ring shaped collector implant structure coincides with an emitter opening defined between edges of the extrinsic base layer.

9. The transistor structure of claim 8, wherein the outer diameter of the ring shaped collector implant structure exceeds an outer diameter of the lower collector implant structure.

10. The transistor structure of claim 2, wherein the intrinsic base layer comprises a single crystal layer of SiGe.

11. A heterojunction bipolar transistor (HBT) device, comprising:
a buried sub-collector region formed within a semiconductor substrate;
a lightly doped collector layer formed over the sub-collector region;
an intrinsic base layer formed over the collector layer;
an emitter formed over the intrinsic base layer;
a raised extrinsic base layer formed over the intrinsic base layer and adjacent the emitter; and
a ring shaped collector implant structure formed within an upper portion of the collector layer, wherein the ring shaped collector implant structure is disposed so as to be aligned beneath a perimeter portion of the emitter.

12. The HBT device of claim 11, further comprising a lower collector implant structure formed within a lower portion of the collector layer, in electrical contact with the ring shaped collector structure, wherein the lower collector implant structure is disposed so as to be aligned beneath an interior, center portion of the emitter.

13. The HBT device of claim 12, wherein the lower collector implant structure and the ring shaped collector structure have a higher dopant concentration with respect to the collector layer.

14. The HBT device of claim 13, wherein a region of the collector layer above the lower collector implant structure, within a perimeter of the ring shaped collector implant structure, and beneath the center of the emitter has a lower dopant concentration than the ring shaped collector implant structure and the lower collector implant structure.

15. The HBT device of claim 14, wherein a first component of base to collector capacitance associated with a collector current path beneath the interior, center portion of the emitter is less than a second component of base to collector capacitance associated with the collector current path beneath the perimeter portion of the emitter.

16. The HBT device of claim 12, wherein the collector layer comprises an N-type material, the lower collector implant structure is doped with N+ type semiconductor material, the ring shaped collector implant structure and sub-collector region are doped with N++ type semiconductor material, and the extrinsic and intrinsic base layers are doped with P-type semiconductor material.

17. The HBT device of claim 12, wherein an outer diameter of the ring shaped collector implant structure coincides with an emitter opening defined between edges of the extrinsic base layer.

18. The HBT device claim 17, wherein the outer diameter of the ring shaped collector implant structure exceeds an outer diameter of the lower collector implant structure.

* * * * *